US011824301B2

(12) United States Patent
Akimoto et al.

(10) Patent No.: US 11,824,301 B2
(45) Date of Patent: Nov. 21, 2023

(54) INTER-BOARD CONNECTION STRUCTURE AND POWER CONVERSION APPARATUS

(71) Applicant: Panasonic Intellectual Property Management Co., Ltd., Osaka (JP)

(72) Inventors: Kiyokatsu Akimoto, Tokyo (JP); Shuzo Isoda, Kanagawa (JP); Yasutoki Manda, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 113 days.

(21) Appl. No.: 17/690,712

(22) Filed: Mar. 9, 2022

(65) Prior Publication Data

US 2022/0294154 A1   Sep. 15, 2022

(30) Foreign Application Priority Data

Mar. 12, 2021   (JP) .................................. 2021-040235

(51) Int. Cl.
*H01R 13/533*   (2006.01)
*H01R 12/73*   (2011.01)

(52) U.S. Cl.
CPC ......... *H01R 13/533* (2013.01); *H01R 12/732* (2013.01)

(58) Field of Classification Search
CPC ................ H01R 13/533; H01R 13/975; H01R 13/7664; H01R 13/7671; H01R 12/732; H01R 12/772; H01R 12/73; H01R 4/302
See application file for complete search history.

(56) References Cited

U.S. PATENT DOCUMENTS

| | | | | |
|---|---|---|---|---|
| 5,531,022 A * | 7/1996 | Beaman | ............. | G01R 1/07371 29/850 |
| 5,982,635 A * | 11/1999 | Menzies | ............... | H05K 7/1092 257/692 |
| 6,132,221 A * | 10/2000 | Matsui | ............... | H01R 43/0256 439/70 |
| 6,165,817 A * | 12/2000 | Akram | ................ | H01L 23/3107 257/E25.023 |
| 6,276,596 B1 * | 8/2001 | Gruber | ................ | H01L 21/4846 228/225 |
| 6,280,207 B1 * | 8/2001 | Sakata | ............... | H01R 13/2414 439/91 |
| 7,220,135 B1 * | 5/2007 | Brekosky | ............. | H01R 12/523 439/75 |
| 7,442,049 B2 * | 10/2008 | Hougham | .......... | H01R 12/7005 439/91 |

(Continued)

FOREIGN PATENT DOCUMENTS

JP   2002-333419 A   11/2002
JP   2003-163435 A   6/2003

*Primary Examiner* — Harshad C Patel
(74) *Attorney, Agent, or Firm* — Seed IP Law Group LLP

(57) ABSTRACT

Provided is an inter-board connection structure including: a first connector provided to the first board; a second connector provided to the second board, the second connector electrically connecting between the first board and the second board; and a vibration suppressor provided on a side of a surface opposite to a first surface where the second connector is placed, the surface opposite to the first surface being referred to as a second surface, the vibration suppressor supporting the second board from the side of the second surface to suppress vibration generated between the first board and the second board.

20 Claims, 4 Drawing Sheets

(56) References Cited

U.S. PATENT DOCUMENTS

| | | | | |
|---|---|---|---|---|
| 7,654,827 B2* | 2/2010 | Arai | ................... | H01R 13/2414 |
| | | | | 439/65 |
| 7,762,819 B2* | 7/2010 | Mori | ...................... | H05K 3/368 |
| | | | | 439/74 |
| 8,066,517 B2* | 11/2011 | Russell | .............. | H01R 13/2414 |
| | | | | 439/91 |
| 8,287,289 B2* | 10/2012 | Niitsu | .................... | H05K 3/368 |
| | | | | 439/66 |
| 9,049,789 B2* | 6/2015 | Ohsawa | ............... | H05K 1/0296 |
| 2003/0093897 A1* | 5/2003 | Augustin | ................ | H05K 3/301 |
| | | | | 29/841 |
| 2005/0085101 A1* | 4/2005 | Chengalva | ........... | H01R 13/719 |
| | | | | 439/62 |
| 2009/0305523 A1* | 12/2009 | Di Stefano | ............ | H01R 4/027 |
| | | | | 439/66 |
| 2013/0130515 A1* | 5/2013 | Huettner | .............. | H01R 13/533 |
| | | | | 439/59 |

* cited by examiner

INTER-BOARD CONNECTION STRUCTURE AND POWER CONVERSION APPARATUS

TECHNICAL FIELD

The present disclosure relates to an inter-board connection structure and a power conversion apparatus.

BACKGROUND ART

Conventionally, a component such as a wiring harness or Flexible Printed Circuit/Flexible Flat Cable (FPC/FFC) (hereinafter the component is referred to as a "harness portion") has been used for electrically connecting between two boards equipped with an electric circuit such as a power conversion circuit. Providing the harness portion makes it possible to absorb vibration in the harness portion even when the vibration is generated in a product including the board mounted therein, and thus, the degree of influence on the electric connection between the boards is small.

The related art discloses a structure for improved shock and vibration isolation of a circuit component utilizing solder column grid arrays to provide electrical connection to a base component.

CITATION LIST

Patent Literature

PTL 1: Japanese Patent Application Laid-Open No. 2003-163435

SUMMARY OF INVENTION

Solution to Problem

An inter-board connection structure according to an embodiment of the present disclosure is for a first board and a second board, the inter-board connection structure including:
- a first connector provided to the first board;
- a second connector provided to the second board, the second connector electrically connecting between the first board and the second board when fitting to the first connector; and
- a vibration suppressor provided on a side of a surface of the second board opposite to a first surface of the second board where the second connector is placed, the surface of the second board opposite to the first surface thereof being referred to as a second surface, the vibration suppressor supporting the second board from the side of the second surface to suppress vibration generated between the first board and the second board.

A power conversion apparatus according to an embodiment of the present disclosure includes:
- a first board and a second board each equipped with an electric circuit related to a power conversion circuit; and
- the above-described inter-board connection structure.

Advantageous Effects of Invention

According to an embodiment of the present disclosure, it is possible to suppress the occurrence of vibration between boards and thus the occurrence of micro-sliding abrasion in a contact portion of a connection portion.

DESCRIPTION OF EMBODIMENTS

Embodiment 1

Figure 1:
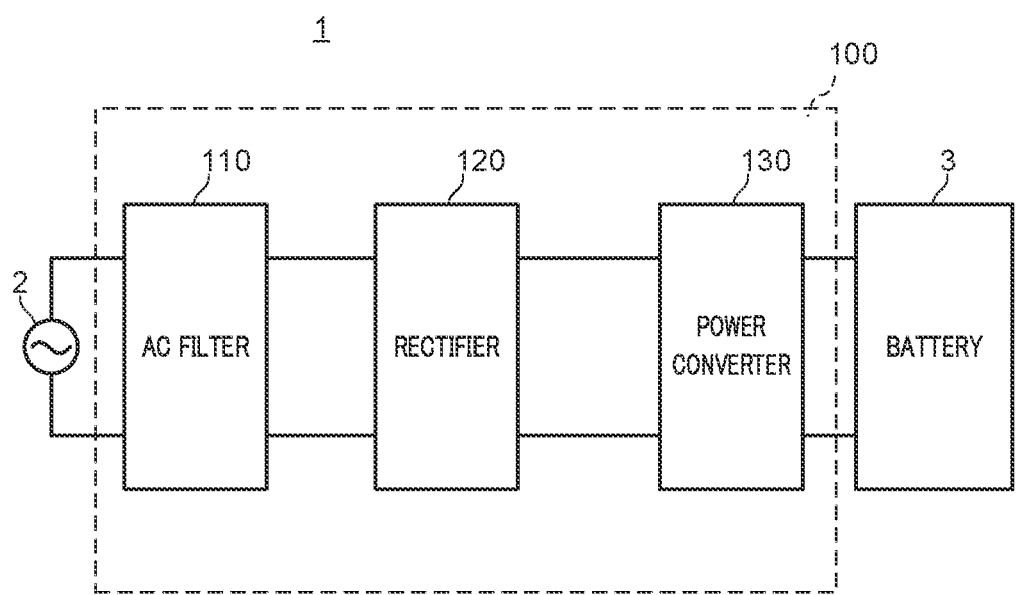
FIG. 1 is a block diagram illustrating a configuration example of a vehicle provided with a power conversion apparatus according to an embodiment of the present disclosure.
Figure 2:
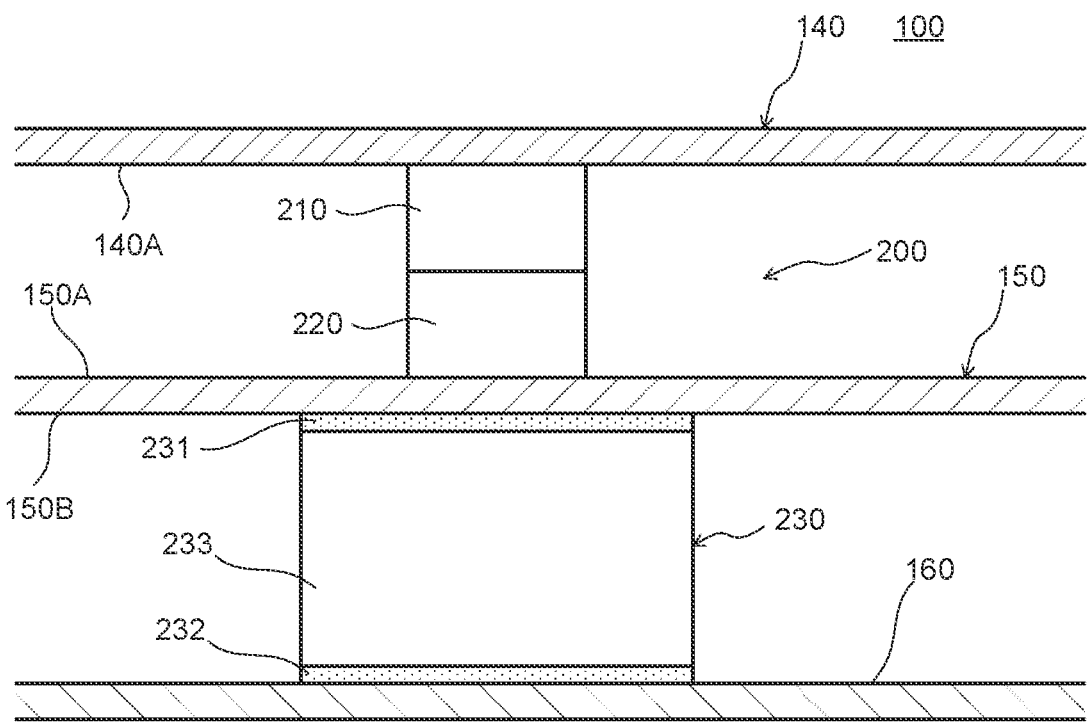
FIG. 2 illustrates an inter-board connection structure according to Embodiment 1.

Hereinafter, embodiments of the present disclosure will be described in detail with reference to the accompanying drawings. FIG. 1 is a block diagram illustrating a configuration example of vehicle 1 provided with power conversion apparatus 100 according to an embodiment of the present disclosure. FIG. 2 illustrates inter-board connection structure 200 according to Embodiment 1.

As illustrated in FIG. 1, power conversion apparatus 100 is a charger that is connected to external AC power source 2 external to vehicle 1 and that converts AC power supplied from external AC power source 2 into DC power to charge battery 3. Battery 3 is, for example, a battery mounted on vehicle 1 such as an electric vehicle or a hybrid vehicle.

Power conversion apparatus 100 includes AC filter 110, rectifier 120, power converter 130 and inter-board connection structure 200 (see FIG. 2) and the like.

AC filter 110 is provided on a power line between external AC power source 2 on one hand and rectifier 120 and power converter 130 on the other.

AC filter 110 is configured of components such as a capacitor and a reactor and serves to remove noise so that the noise superimposed on the power line does not flow out to external AC power source 2. Moreover, AC filter 110 secondarily serves to remove noise superimposed on the AC power input from external AC power source 2.

Rectifier 120 includes, for example, a diode-bridge circuit composed of four diodes, converts the AC power output from external AC power source 2 to the DC power by performing full-wave rectification, and thereby outputs the resulting DC power to power converter 130.

Power converter 130 includes power conversion circuits such as a power factor correction circuit and a DC/DC conversion circuit. The power factor correction circuit improves the power factor of the DC power input from rectifier 120. The DC/DC conversion circuit includes a switching element and converts, by switching of the switching element, the DC power output from power factor correction circuit into DC power capable of charging battery 3. The DC power resulting from the conversion by power converter 130 in the manner described above is output to battery 3, and battery 3 is thus charged.

Each part of power conversion apparatus 100 is housed in one casing. Further, as illustrated in FIG. 2, the casing includes first board 140 and second board 150 each equipped with an electric circuit and/or the like related to the power conversion circuit (power converter). First board 140 and second board 150 are arranged to face each other and are electrically connected to each other by inter-board connection structure 200.

Inter-board connection structure 200 includes first connector 210, second connector 220, and vibration suppressor 230.

First connector 210 and second connector 220 are connectors fittable with each other. One of first connector 210 and second connector 220 is a male terminal, and the other of first connector 210 and second connector 220 is a female terminal.

First connector 210 is provided on surface 140A facing second board 150 in first board 140. Second connector 220 is provided on first surface 150A facing first board 140 in second board 150. When first connector 210 and second connector 220 fit with each other, first board 140 and second board 150 are electrically connected to each other.

Vibration suppressor 230 suppresses vibration generated between first board 140 and second board 150. Vibration suppressor 230 is provided, in second board 150, on second surface 150B opposite to first surface 150A on which second connector 220 is placed.

Vibration suppressor 230 is provided between second board 150 and separate member 160 provided with a gap from second board 150 so as to partially fill a space between second board 150 and separate member 160.

Separate member 160 may be any member, such as a component used for different purposes from vibration suppressor 230, or a wall of the casing. Examples of the component used for different purposes include a board provided separately from first board 140 and second board 150, and a sheet metal (filter) for measures against electromagnetic compatibility (EMC) and the like.

Vibration suppressor 230 is placed to support second surface 150B from a back side of an area where second connector 220 is provided in second board 150. Vibration suppressor 230 includes first layer 231, second layer 232, and third layer 233.

First layer 231 and second layer 232 are elastic bodies such as rubber, and are surface layers of vibration suppressor 230. First layer 231 is a surface layer on the side of second board 150 in vibration suppressor 230, and is in contact with second surface 150B of second board 150. Second layer 232 is a surface layer positioned opposite first layer 231 in vibration suppressor 230, and is in contact with separate member 160. First layer 231 corresponds to an "elastic layer" of the present disclosure. Second layer 232 corresponds to an "elastic body" of the present disclosure.

Third layer 233 is an insulator (inelastic layer) such as, for example, a resin (e.g., polybutylene terephthalate) and is an intermediate layer of vibration suppressor 230. Third layer 233 holds first layer 231 in between with second board 150, so that the heat of second board 150 is transferred through first layer 231.

According to the present embodiment configured as described above, vibration suppressor 230 suppresses vibration generated between first board 140 and second board 150. Specifically, vibration suppressor 230 is provided to support second board 150 from the back side of second connector 220 of second board 150.

Consequently, a portion of second connector 220 of second board 150 can be supported by vibration suppressor 230 from the side of second surface 150B, and thus, vibration suppressor 230 can suppress the vibration generated between first board 140 and second board 150 due to disturbance and the like.

As a result, it is possible to suppress the occurrence of micro-sliding abrasion caused by the vibration generated between first board 140 and second board 150 in a contact portion between first connector 210 and second connector 220, and thus, the occurrence of disconnection due to an increase in contact resistance can be also suppressed.

Moreover, since second board 150 is supported by vibration suppressor 230 from the back side of the portion of second board 150 corresponding to second connector 220, it is possible to further suppress the vibration generated between first board 140 and second board 150.

Furthermore, since vibration suppressor 230 is in contact with second surface 150B of second board 150 at first layer 231, it is possible to easily absorb, by an elastic force of first layer 231, the vibration from second board 150. Incidentally, first layer 231 is preferably formed thinly from the viewpoint of a reduction in amplitude of second board 150. The thickness of first layer 231 can be appropriately set to a thickness capable of reducing the amplitude of second board 150.

Furthermore, since vibration suppressor 230 includes third layer 233 that is an inelastic layer, supporting second board 150 from the back side makes it possible to reduce the amplitude of the vibration generated between first board 140 and second board 150.

Furthermore, since third layer 233 is composed of an insulator, there is no need to ensure an insulation distance in between with another peripheral member on the board. In a case where the third layer is composed of a conductive member, it is necessary to ensure the insulation distance in between with the peripheral member, which may lead to an increase in size of the apparatus. In contrast, in the present embodiment, third layer 233 is an insulator; thus, there is no need to ensure the insulation distance and space-saving for the apparatus can be achieved, which contributes to making the apparatus compact.

Furthermore, since third layer 233 is formed of a resin, i.e., it can be composed of a material having relatively high heat capacity. Consequently, vibration suppressor 230 is configured to be capable of absorbing heat of second board 150 and thereby cooling second board 150. Incidentally, a heat sink or the like for radiating heat stored in vibration suppressor 230 may be provided separately.

Furthermore, since vibration suppressor 230 is provided on the back side of second board 150, a load from the side of first board 140 is transmitted to vibration suppressor 230 through first board 140, first connector 210, second connector 220 and second board 150. Thus, it is possible to improve the rigidity against deformation caused by the load.

Furthermore, since second layer 232 is formed of an elastic body, it is possible to suppress a mutual rub between vibration suppressor 230 and separate member 160.

Embodiment 2

Figure 3:
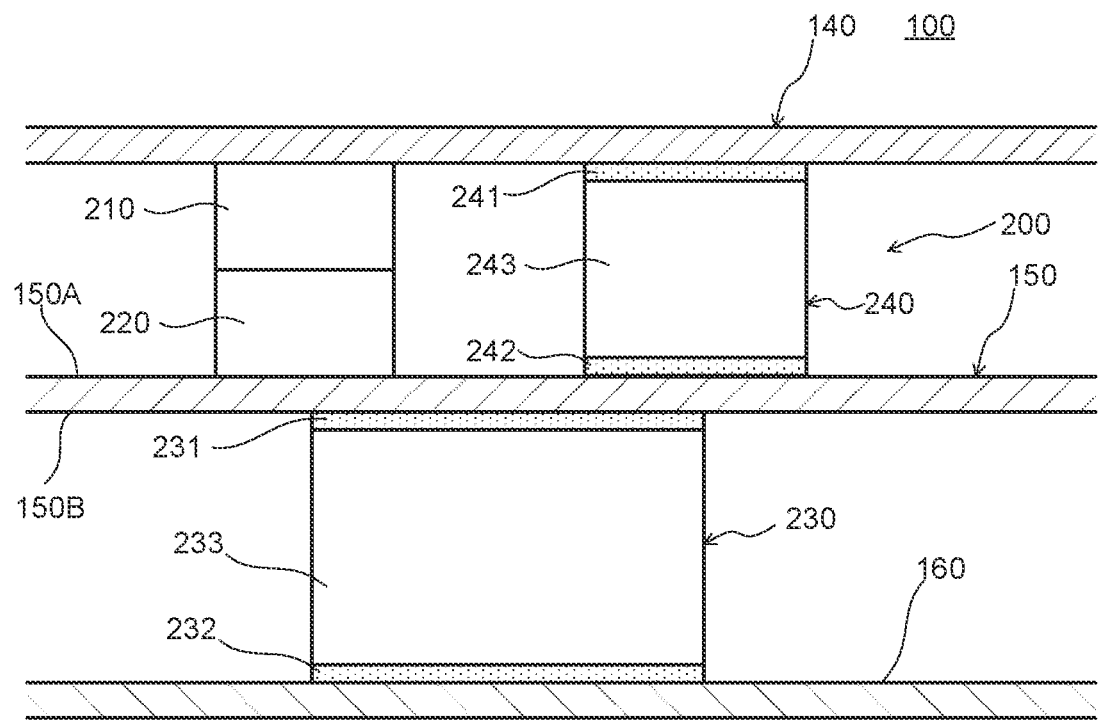
FIG. 3 illustrates an inter-board connection structure according to Embodiment 2.

Next, a description will be given of Embodiment 2. FIG. 3 illustrates an inter-board connection structure according to Embodiment 2.

As illustrated in FIG. 3, inter-board connection structure 200 according to Embodiment 2 includes second vibration suppressor 240 in addition to first connector 210, second connector 220 and vibration suppressor 230.

Second vibration suppressor 240 suppresses vibration generated between first board 140 and second board 150. Second vibration suppressor 240 is placed, between first board 140 and second board 150, on a position different from a position of first connector 210 and second connector 220 and is provided to partially fill a space between first board 140 and second board 150.

Second vibration suppressor 240 includes first layer 241, second layer 242 and third layer 243 as with vibration suppressor 230 vibration suppressor 230 includes.

First layer 241 and second layer 242 are elastic bodies such as rubber as with first layer 231 and second layer 232 of vibration suppressor 230. First layer 241 is a surface layer on the side of first board 140 and is contact with first board 140. Second layer 242 is a surface layer on the side of second board 150 and is contact with second board 150.

Third layer 243 is an insulator such as a resin (inelastic body) and is an intermediate layer of second vibration suppressor 240 as with third layer 233 of vibration suppressor 230.

Further, vibration suppressor 230 in Embodiment 2 is placed in a position on the back side of both second connector 220 and second vibration suppressor 240. Specifically, vibration suppressor 230 is placed such that one end portion of vibration suppressor 230 is positioned on the back side of a portion of second connector 220, and the other end portion of vibration suppressor 230 is positioned on the back side of a portion of second vibration suppressor 240. In other words, second connector 220 and second vibration suppressor 240 are arranged substantially symmetrically with respect to vibration suppressor 230.

According to Embodiment 2 configured as described above, since second vibration suppressor 240 is provided between first board 140 and second board 150, even when vibration that causes first board 140 and second board 150 to approach with each other is generated, the vibration can be suppressed by second vibration suppressor 240. As a result, it is possible to further improve the effect of vibration suppression by vibration suppressor 230.

Moreover, since second connector 220 and second vibration suppressor 240 are arranged symmetrically with respect to vibration suppressor 230, a load applied to second board 150 from second connector 220 and second vibration suppressor 240 can be received evenly by vibration suppressor 230. Consequently, second board 150 can be stably supported by vibration suppressor 230, and thus it is possible to improve the effect of vibration suppression by vibration suppressor 230.

In addition, since third layer 243 of second vibration suppressor 240 is an insulator, there is no need to ensure an insulation distance in between with another peripheral member on the board, and thus space-saving for the apparatus can be achieved.

Further, since third layer 243 is formed of a resin, i.e., it can be composed of a material having relatively high heat capacity. Consequently, second vibration suppressor 240 is configured to be capable of absorbing heat of first board 140 and second board 150 and thereby cooling first board 140 and second board 150.

Embodiment 3

Figure 4:
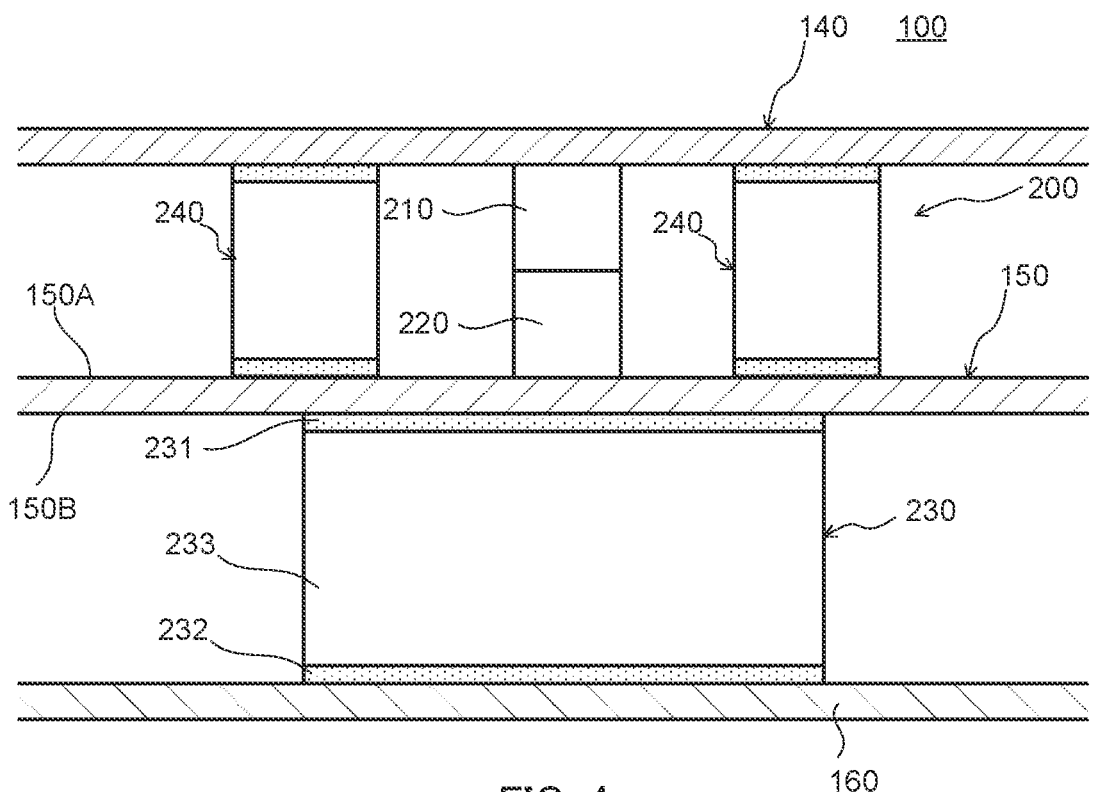
FIG. 4 illustrates an inter-board connection structure according to Embodiment 3.

Next, a description will be given of Embodiment 3. FIG. 4 illustrates an inter-board connection structure according to Embodiment 3.

In Embodiment 2, one second vibration suppressor 240 is provided, but in Embodiment 3, second vibration suppressors 240 are provided one each for both sides of first connector 210 and second connector 220 as illustrated in FIG. 4. A configuration of each of second vibration suppressors 240 is the same as second vibration suppressor 240 in Embodiment 2.

Meanwhile, as in Embodiment 1, vibration suppressor 230 is placed on the back side of second connector 220. Specifically, vibration suppressor 230 is placed such that one end portion of vibration suppressor 230 is positioned on the back side of a portion of one second vibration suppressor 240 and the other end of vibration suppressor 230 is positioned on the back side of a portion of the other second vibration suppressor 240. In other words, two second vibration suppressors 240 are arranged symmetrically with respect to vibration suppressor 230.

According to Embodiment 3 configured as described above, since two second vibration suppressors 240 are provided between first board 140 and second board 150, even when vibration that causes first board 140 and second board 150 to approach with each other is generated, the vibration can be further suppressed by two second vibration suppressors 240. As a result, it is possible to further improve the effect of vibration suppression by vibration suppressor 230.

In addition, since two second vibration suppressors 240 are arranged symmetrically with respect to vibration suppressor 230, a load applied to second board 150 from two second vibration suppressors 240 can be received evenly by vibration suppressor 230. Consequently, second board 150 can be stably supported by vibration suppressor 230, and thus it is possible to improve the effect of vibration suppression by vibration suppressor 230.

Figure 5:
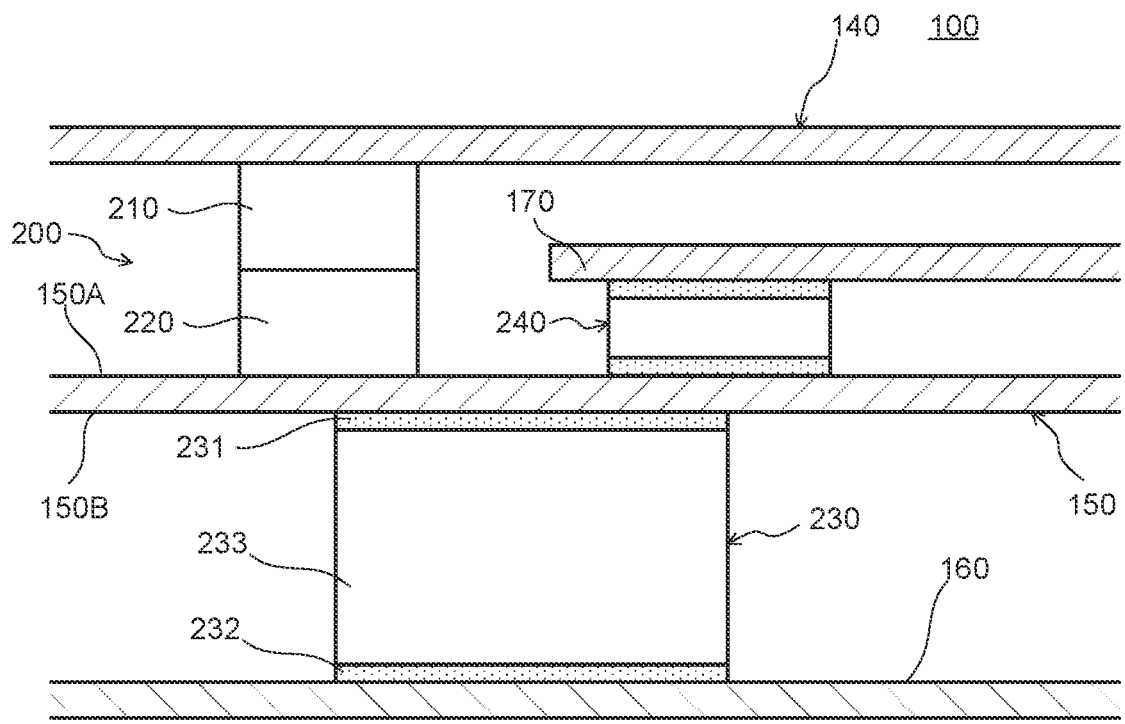
FIG. 5 illustrates an inter-board connection structure according to a variation.

Furthermore, in Embodiment 2 and the like described above, second vibration suppressor(s) 240 is/are provided so as to partially fill the space between first board 140 and second board 150, but the present disclosure is not limited to this. In one example, as illustrated in FIG. 5, second vibration suppressor 240 may be provided to partially fill a space between separate member 170, which is placed between first board 140 and second board 150 (e.g., noise filter or the like), and second board 150.

Figure 6:
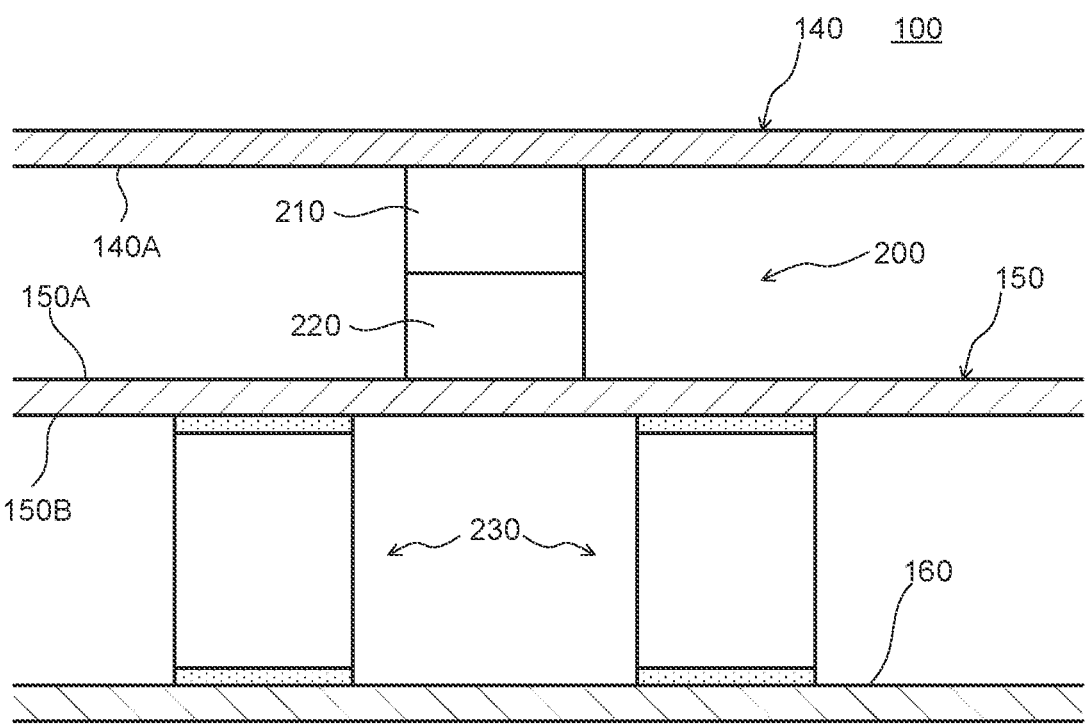
FIG. 6 illustrates an inter-board connection structure according to another variation.

Furthermore, in the above-described embodiments, one vibration suppressor 230 is provided, but the present disclosure is not limited to this, and a plurality of vibration suppressors 230 may be provided. In addition, as illustrated in FIG. 6, when two vibration suppressors 230 are provided, it is preferable to arrange two vibration suppressors 230 symmetrically with respect to second connector 220.

In the manner described above, two vibration suppressors 230 can support the portion of second board 150 corresponding to second connector 220 with good balance.

Moreover, as long as two vibration suppressors 230 are arranged symmetrically with respect to second connector 220, each of vibration suppressors 230 may be placed in a position that is not on the back side of second connector 220.

Furthermore, in the above-described embodiments, the second layer (elastic body) is provided in the vibration suppressor, but the present disclosure is not limited to this, and the second layer may not be provided. Besides, the elastic body capable of being brought into contact with the vibration suppressor may be provided on the side of the separate member.

Furthermore, in the above-described embodiments, a description has been given with an example of the inter-board connection structure in the power conversion apparatus of the vehicle, the present disclosure is not limited to this, and the present disclosure may be directed to an inter-board connection structure in a power conversion apparatus of other than a vehicle.

Furthermore, in the above-described embodiments, a description has been given with an example of the inter-board connection structure in the power conversion apparatus, but the present disclosure is not limited to this, and the present disclosure may be directed to an inter-board connection structure in an apparatus other than a power conversion apparatus.

The embodiments described above are merely examples of specific implementation of the present disclosure, and the technical scope of the present disclosure should not be restrictively interpreted by these embodiments. That is, the present disclosure may be implemented in various forms without departing from the spirit thereof or the major features thereof.

While various embodiments have been described herein above, it is to be appreciated that various changes in form and detail may be made without departing from the spirit and scope of the invention(s) presently or hereafter claimed.

This application is entitled to and claims the benefit of Japanese Patent Application No. 2021-040235, filed on Mar. 12, 2021, the disclosure of which including the specification, drawings and abstract is incorporated herein by reference in its entirety.

INDUSTRIAL APPLICABILITY

The inter-board connection structure of the present disclosure is useful as inter-board connection structures and power conversion apparatuses each capable of suppressing the occurrence of vibration between boards and thus the occurrence of micro-sliding abrasion in a contact portion of a connection portion.

The invention claimed is:

1. An inter-board connection structure for a first board and a second board, the inter-board connection structure comprising:
   a first connector provided to the first board;
   a second connector provided to the second board, the second connector electrically connecting between the first board and the second board when fitting to the first connector; and
   a vibration suppressor provided on a side of a surface of the second board opposite to a first surface of the second board where the second connector is placed, the surface of the second board opposite to the first surface thereof being referred to as a second surface, the vibration suppressor supporting the second board from the side of the second surface to suppress vibration generated between the first board and the second board.

2. The inter-board connection structure according to claim 1, wherein the vibration suppressor supports the second board from a back side of a portion of the second board at least partially corresponding to an area where the second connector is provided.

3. The inter-board connection structure according to claim 2, wherein the vibration suppressor includes an elastic layer provided in contact with the second surface.

4. The inter-board connection structure according to claim 2, further comprising a second vibration suppressor placed between the first board and the second board, the second vibration suppressor suppressing the vibration generated between the first board and the second board.

5. The inter-board connection structure according to claim 2, wherein the vibration suppressor is configured to be capable of absorbing heat of the second board.

6. The inter-board connection structure according to claim 1, wherein the vibration suppressor includes an elastic layer provided in contact with the second surface.

7. The inter-board connection structure according to claim 6, wherein the vibration suppressor includes an inelastic layer provided to hold the elastic layer between the inelastic layer and the second board.

8. The inter-board connection structure according to claim 7, wherein the inelastic layer is an insulator.

9. The inter-board connection structure according to claim 8, wherein the vibration suppressor includes an elastic body positioned opposite the elastic layer with respect to the inelastic layer.

10. The inter-board connection structure according to claim 8, further comprising a second vibration suppressor placed between the first board and the second board, the second vibration suppressor suppressing the vibration generated between the first board and the second board.

11. The inter-board connection structure according to claim 8, wherein the vibration suppressor is configured to be capable of absorbing heat of the second board.

12. The inter-board connection structure according to claim 7, wherein the vibration suppressor includes an elastic body positioned opposite the elastic layer with respect to the inelastic layer.

13. The inter-board connection structure according to claim 12, further comprising a second vibration suppressor placed between the first board and the second board, the second vibration suppressor suppressing the vibration generated between the first board and the second board.

14. The inter-board connection structure according to claim 7, further comprising a second vibration suppressor placed between the first board and the second board, the second vibration suppressor suppressing the vibration generated between the first board and the second board.

15. The inter-board connection structure according to claim 7, wherein the vibration suppressor is configured to be capable of absorbing heat of the second board.

16. The inter-board connection structure according to claim 6, further comprising a second vibration suppressor placed between the first board and the second board, the second vibration suppressor suppressing the vibration generated between the first board and the second board.

17. The inter-board connection structure according to claim 6, wherein the vibration suppressor is configured to be capable of absorbing heat of the second board.

18. The inter-board connection structure according to claim 1, further comprising a second vibration suppressor placed between the first board and the second board, the second vibration suppressor suppressing the vibration generated between the first board and the second board.

19. The inter-board connection structure according to claim 1, wherein the vibration suppressor is configured to be capable of absorbing heat of the second board.

20. A power conversion apparatus, comprising:
   a first board and a second board each equipped with an electric circuit related to a power conversion circuit; and
   an inter-board connection structure for the first board and the second board, the inter-board connection structure including: a first connector provided to the first board; a second connector provided to the second board, the second connector electrically connecting between the first board and the second board when fitting to the first connector; and a vibration suppressor provided on a side of a surface of the second board opposite to a first surface of the second board where the second connector is placed, the surface of the second board opposite to the first surface thereof being referred to as a second surface, the vibration suppressor supporting the second board from the side of the second surface to suppress vibration generated between the first board and the second board.

\* \* \* \* \*